United States Patent
Seo

(10) Patent No.: US 11,398,412 B2
(45) Date of Patent: Jul. 26, 2022

(54) SEMICONDUCTOR PACKAGE

(71) Applicant: SK hynix Inc., Icheon-si (KR)

(72) Inventor: Hyun Chul Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/096,333

(22) Filed: Nov. 12, 2020

(65) Prior Publication Data

US 2022/0013419 A1     Jan. 13, 2022

(30) Foreign Application Priority Data

Jul. 8, 2020 (KR) .................. 10-2020-0084078

(51) Int. Cl.
    *H01L 21/66*     (2006.01)
    *H01L 23/00*     (2006.01)

(52) U.S. Cl.
    CPC .............. *H01L 22/32* (2013.01); *H01L 24/14* (2013.01); *H01L 2224/14515* (2013.01)

(58) Field of Classification Search
    CPC ................................ H01L 24/04; H01L 24/14
    See application file for complete search history.

(56) References Cited

U.S. PATENT DOCUMENTS

2014/0339704 A1* 11/2014 Ahn .................. H01L 25/0657
    257/773

FOREIGN PATENT DOCUMENTS

KR      101320934 B1    10/2013

\* cited by examiner

*Primary Examiner* — Trang Q Tran
(74) *Attorney, Agent, or Firm* — William Park & Associates Ltd.

(57) ABSTRACT

A semiconductor package includes a semiconductor chip with a normal connection electrode and a measurement connection electrode, formed on a first surface, and a substrate with a normal substrate pad, connected to the normal connection electrode, and a measurement substrate pad, connected to the measurement connection electrode. The normal substrate pad and the measurement substrate pad are formed on a surface that faces the first surface. The measurement connection electrode includes first and second edge measurement connection electrodes and first and second center measurement connection electrodes. The measurement substrate pad includes a center measurement substrate pad, a first edge measurement substrate pad, and a second edge measurement substrate pad. The first edge measurement connection electrode and the first center measurement connection electrode are electrically connected to each other, and the second edge measurement connection electrode and the second center measurement connection electrode are electrically connected to each other.

18 Claims, 13 Drawing Sheets

SEMICONDUCTOR PACKAGE

CROSS-REFERENCE TO RELATED APPLICATION

This application claims priority under 35 U.S.C. § 119 to Korean Patent Application No. 10-2020-0084078 filed on Jul. 8, 2020, which is incorporated herein by reference in its entirety.

BACKGROUND

1. Technical Field

This patent document relates to a semiconductor package, and more particularly, to a semiconductor package in which a semiconductor chip is mounted on a substrate.

2. Related Art

A semiconductor chip may be mounted on a substrate in various ways. As an example, a method of attaching a connection electrode of a semiconductor chip to a pad that is formed on a surface of a substrate, for example, a flip chip bonding method, may be used.

In the flip chip bonding process, various methods may be used to check whether the connection electrode of the semiconductor chip is correctly bonded to the substrate pad.

SUMMARY

In an embodiment, a semiconductor package may include: a semiconductor chip including a normal connection electrode and a measurement connection electrode that are formed on a first surface; and a substrate including a normal substrate pad that is connected to the normal connection electrode and a measurement substrate pad that is connected to the measurement connection electrode, the normal substrate pad and the measurement substrate pad being formed on a surface that faces the first surface, wherein the measurement connection electrode includes first and second edge measurement connection electrodes that are formed at both side edge regions of the semiconductor chip, respectively, the side edge regions running along a first direction, and first and second center measurement connection electrodes that are arranged in a center region of the semiconductor chip to be spaced apart from each other, the center region disposed between the both side edge regions in the first direction, wherein the measurement substrate pad includes a center measurement substrate pad with a long side in an arrangement direction of the first and second center measurement connection electrodes to simultaneously connect the first and second center measurement connection electrodes, a first edge measurement substrate pad with a long side crossing the center measurement substrate pad while being connected to the first edge measurement connection electrode, and a second edge measurement substrate pad with a long side crossing the center measurement substrate pad while being connected to the second edge measurement connection electrode, and wherein the first edge measurement connection electrode and the first center measurement connection electrode are electrically connected to each other, and the second edge measurement connection electrode and the second center measurement connection electrode are electrically connected to each other.

DETAILED DESCRIPTION

Figure 1A:
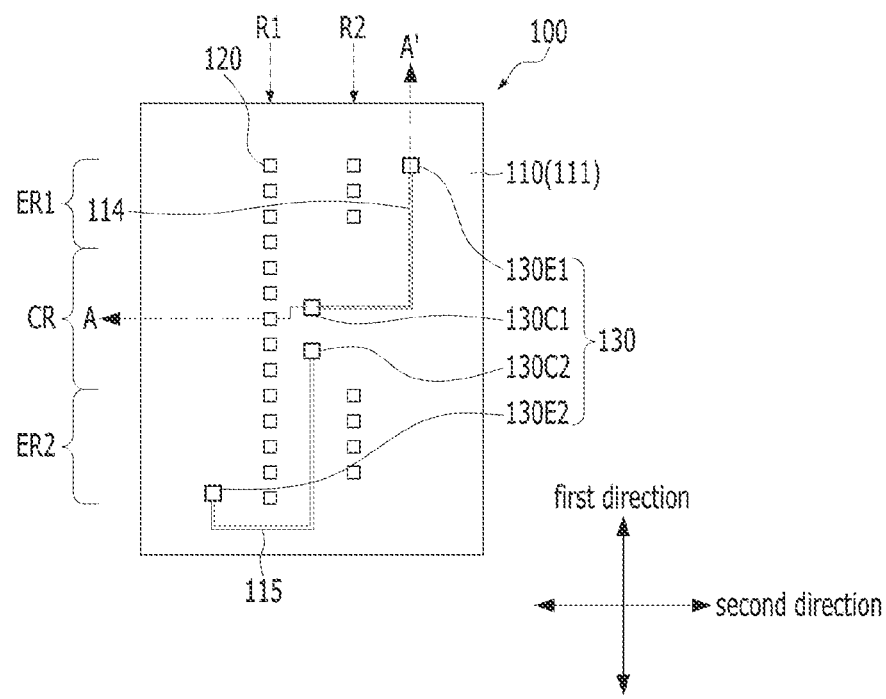
FIG. 1A is a plan view, illustrating a semiconductor chip of a semiconductor package, according to an embodiment of the present disclosure.

Hereinafter, various examples of embodiments of the disclosure will be described in detail with reference to the accompanying drawings.

The drawings might not be necessarily to scale and in some instances, proportions of at least some of structures in the drawings may have been exaggerated in order to clearly illustrate certain features of the described examples or implementations. In presenting a specific example in a drawing or description with two or more layers in a multi-layer structure, the relative positioning relationship of such layers or the sequence of arranging the layers, as shown, reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Hereinafter, a semiconductor package according to an embodiment of the present disclosure will be described with reference to FIGS. 1A to 3B.

Figure 1B:
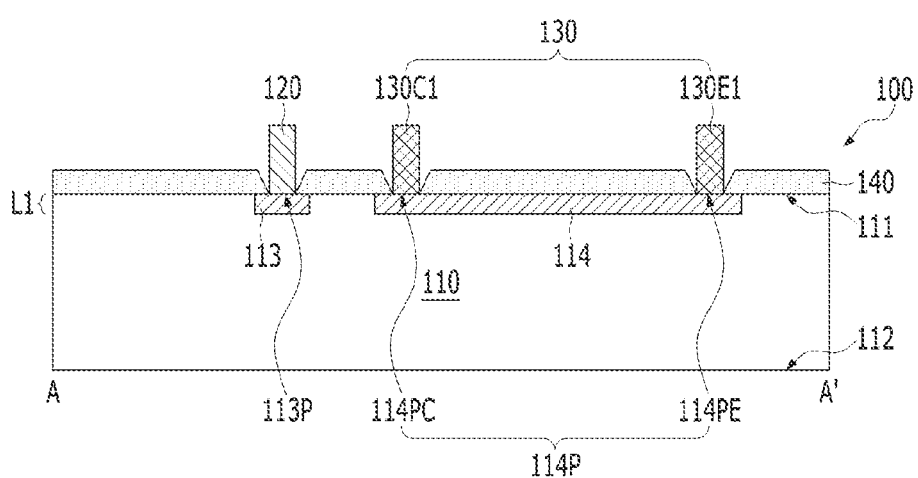
FIG. 1B is a cross-sectional view that is taken along a line A-A' of FIG. 1A.
Figure 2:
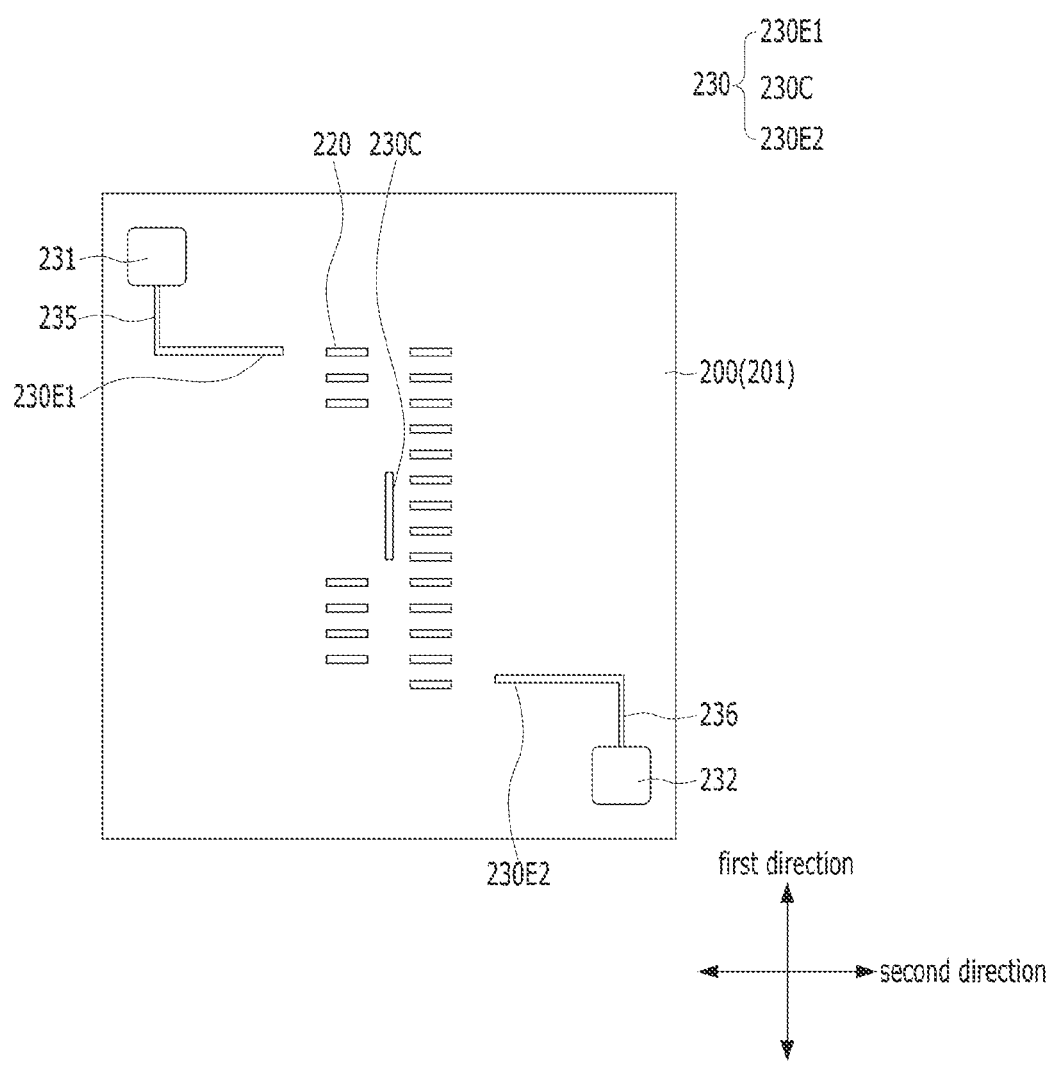
FIG. 2 is a plan view, illustrating a substrate of a semiconductor package, according to an embodiment of the present disclosure.
Figure 3A:
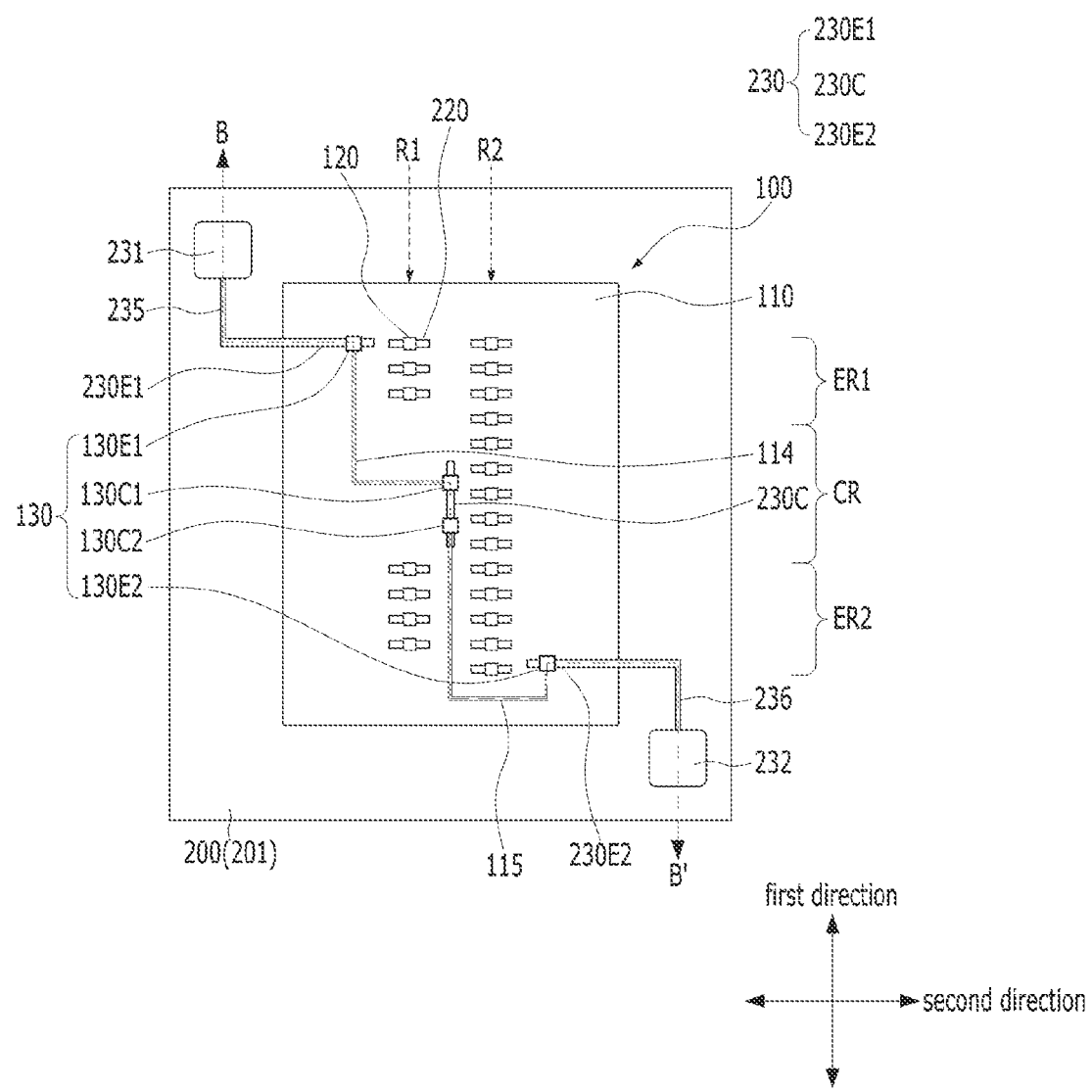
FIG. 3A is a plan view, illustrating a semiconductor package in a state in which the semiconductor chip of FIGS. 1A and 1B is mounted on the substrate of FIG. 2.
Figure 3B:
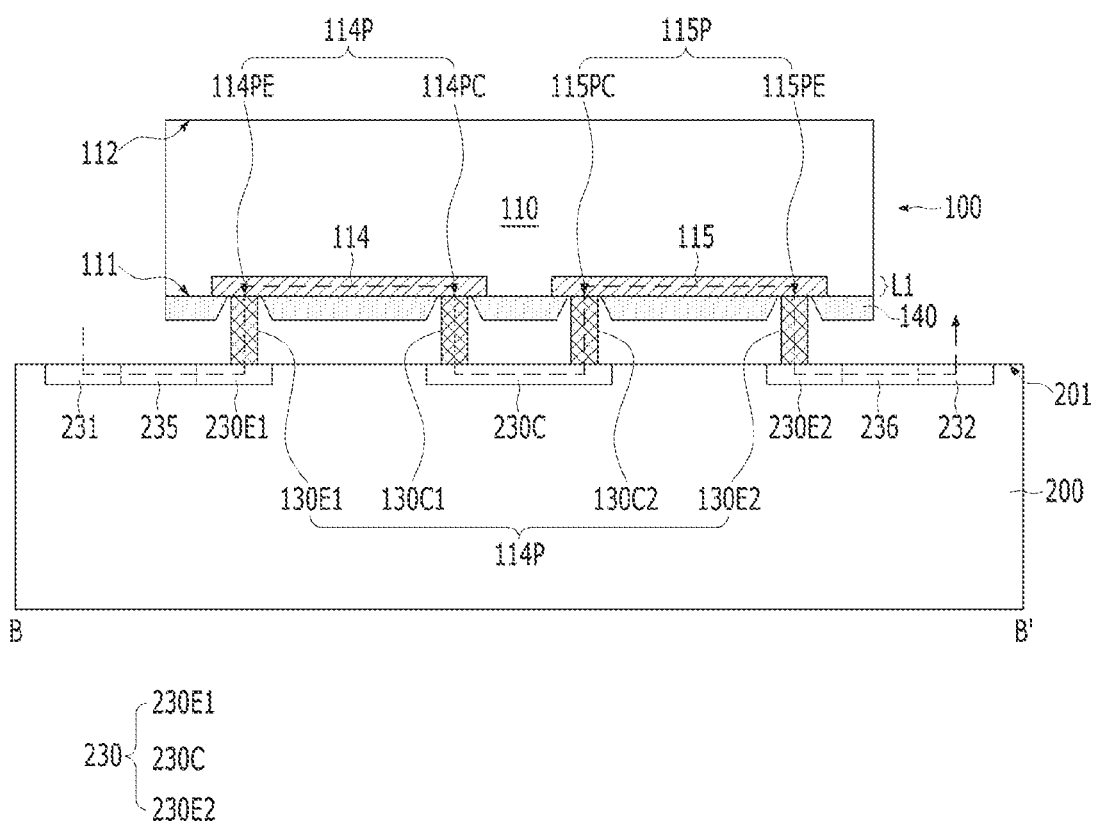
FIG. 3B is a cross-sectional view that is taken along a line B-B' of FIG. 3A.

FIG. 1A is a plan view, illustrating a semiconductor chip of a semiconductor package, according to an embodiment of the present disclosure, and FIG. 1B is a cross-sectional view that is taken along a line A-A' of FIG. 1A. FIG. 2 is a plan view, illustrating a substrate of a semiconductor package, according to an embodiment of the present disclosure. FIG. 3A is a plan view, illustrating a semiconductor package in a state in which the semiconductor chip of FIGS. 1A and 1B is mounted on the substrate of FIG. 2, and FIG. 3B is a cross-sectional view that is taken along a line B-B' of FIG. 3A.

First, referring to FIGS. 1A and 1B, a semiconductor chip 100 according to the present embodiment may be provided. The semiconductor chip 100 may include a body portion 110 and a plurality of connection electrodes 120 and 130 attached on a first surface 111 of the body portion 110 and electrically connected to the semiconductor chip 100.

The body portion 110 may include the first surface 111, a second surface 112 that faces the first surface 111, and side surfaces that connect the first surface 111 and the second surface 112. In FIG. 1B, the semiconductor chip 100 may be disposed so that the first surface 111 faces upward, and the second surface 112 faces downward. However, relative positions of the first surface 111 and the second surface 112 may be modified. For example, when the semiconductor chip 100 is mounted on a substrate (refer to "200" in FIGS. 2 to 3B), which will be described later, the semiconductor chip 100 may be mounted with the first surface 111 that faces downward. FIG. 1A is a plan view, illustrating the first surface 111.

The body portion 110 may include a multi-layered wiring structure that performs a required function of the semiconductor chip 100. In the present embodiment, for convenience of description, only a wiring layer L1 of the multi-layered wiring structure is illustrated. The wiring layer L1 may have one surface that is positioned at the same level as the first surface 111, and may contact the connection electrodes 120 and 130. In a state in which the semiconductor chip 100 is disposed with the first surface 111 that faces upward, as shown in FIG. 1B, the wiring layer L1 may be a wiring layer that is positioned at the uppermost portion of the multi-layered wiring structure. The wiring layer L1 may include a plurality of conductive patterns with various shapes (see 113, 114, and 115 in FIGS. 1A and 1B). These conductive patterns will be described later while describing the connection electrodes 120 and 130.

On the first surface 111 of the body portion 110, an insulating layer 140 may be formed. The insulating layer 140 may have openings that expose portions of the wiring layer L1 while covering the first surface 111 of the body portion 110. The connection electrodes 120 and 130 may be connected to the wiring layer L1 through these openings. The portions of the wiring layer L1 that are exposed by the openings of the insulating layer 140 may be referred to as pads. These pads will be described later while describing the connection electrodes 120 and 130.

The connection electrodes 120 and 130 may include a normal connection electrode 120 and a measurement connection electrode 130.

The normal connection electrode 120 may be a connection electrode to which a signal or power, required for the operation of the semiconductor chip 100, is applied. In the present embodiment, a plurality of normal connection electrodes 120 may be arranged in a first column R1 and a second column R2 in a plan view. That is, each of the first column R1 and the second column R2 may include a plurality of normal connection electrodes 120 that are arranged in a line along a first direction. The first column R1 and the second column R2 may be arranged to be spaced apart from each other in a second direction, the second direction being a direction that crosses the first direction. The number of normal connection electrodes 120 that are included in the first column R1 may be different from the number of normal connection electrodes 120 that are included in the second column R2. The first column R1 and the second column R2 may be located in a center region of the semiconductor chip 100 in the second direction. For reference, the center region may mean a remaining region besides the two edge regions in the second direction. Both edge regions may correspond to a region of which a distance from both side surfaces of the semiconductor chip 100 in the second direction is less than half of the width of the semiconductor chip 100 in the second direction. However, the present disclosure is not limited thereto, and the number, position, and arrangement of the normal connection electrodes 120 may be variously modified.

A conductive pattern of the wiring layer L1, which is connected to the normal connection electrode 120, will be referred to as a normal conductive pattern 113. In addition, a portion of the normal conductive pattern 113 that is exposed by the opening that is formed in the insulating layer 140 will be referred to as a normal pad 113P. The normal connection electrode 120 may be electrically connected to the normal conductive pattern 113 by directly or indirectly contacting the normal pad 113P. The normal conductive pattern 113 may be a part of the multi-layered wiring structure of the body portion 110 and may transmit a signal or supply power to the normal connection electrode 120. In the plan view of FIG. 1A, the illustration of the normal conductive pattern 113 and the normal pad 113P is omitted. However, the normal conductive pattern 113 may have various planar shapes for the transmission of signals and power. The normal pad 113P may overlap with each of the normal connection electrodes 120 and may have a slightly larger planar shape than each of the normal connection electrodes 120. Like the normal connection electrode 120, the normal pad 113P may also be disposed in the center region of the semiconductor chip 100. Therefore, the semiconductor chip 100 may be referred to as a center-pad type semiconductor chip.

The measurement connection electrode 130 may be a connection electrode that detects whether a connection between the normal connection electrode 120 and a normal substrate pad 220, which will be described in more detail later, is normally made. Here, the measurement connection electrode 130 may be disposed to be adjacent to the normal connection electrode 120 and may be disposed by considering the regions of the semiconductor chip 100. More specifically, it is as follows.

As described above, the plurality of normal connection electrodes 120 may be arranged in the first column R1 and the second column R2 along the first direction. In this case, in the first direction, both edge regions of a region in which the plurality of normal connection electrodes 120 are arranged will be referred to as a first edge region ER1 and a second edge region ER2, respectively, and a region between the first edge region ER1 and the second edge region ER2 will be referred to as a center region CR. The first edge region ER1 may be a region of which a distance from the normal connection electrode 120 that is closest to one side surface of the semiconductor chip 100 in the first direction is less than half of a width of the region in which the plurality of normal connection electrodes 120 are arranged in the first direction. The second edge region ER2 may be a region of which a distance from the normal connection electrode 120 that is closest to the other side surface of the semiconductor chip 100 in the first direction is less than half of a width of the region in which the plurality of normal connection electrodes 120 are arranged in the first direction.

In this case, the measurement connection electrode 130 may include a first edge measurement connection electrode 130E1 that is disposed in the first edge region ER1, first and second center measurement connection electrodes 130C1 and 130C2 that are disposed in the center region CR, and a second edge measurement connection electrode 130E2 that is disposed in the second edge region ER2. The first and second edge measurement connection electrodes 130E1 and 130E2 may be disposed at both sides of the first and second columns R1 and R2 in the second direction, respectively. In the plan view of FIG. 1A, the first edge measurement connection electrode 130E1 may be disposed at the right side of the second column R2 and the second edge measurement connection electrode 130E2 may be disposed at the left side of the first column R1. However, the present disclosure is not limited thereto. In another embodiment, the first edge measurement connection electrode 130E1 may be disposed at the left side of the first column R1 and the second edge measurement connection electrode 130E2 may be disposed at the right side of the second column R2. The first and second center measurement connection electrodes 130C1 and 130C2 may be disposed between the first column R1 and the second column R2 in the second direction. The first and second center measurement connection electrodes 130C1 and 130C2 may be arranged at a predetermined interval along the first direction.

A conductive pattern of the wiring layer L1, which is connected to the first edge measurement connection electrode 130E1 and the first center measurement connection electrode 130C1 to connect them, will be referred to as a first measurement conductive pattern 114. The first measurement conductive pattern 114 may have a line shape that extends between the first edge measurement connection electrode 130E1 and the first center measurement connection electrode 130C1. Both ends of the first measurement conductive pattern 114 may be exposed by the openings that are formed in the insulating layer 140, and these exposed portions will be referred to as first measurement pads 114P. Among the first measurement pads 114P, a pad that is connected to the first edge measurement connection electrode 130E1 will be referred to as a first edge measurement pad 114PE, and a pad that is connected to the first center measurement connection electrode 130C1 will be referred to as a first center measurement pad 114PC.

In addition, a conductive pattern of the wiring layer L1, which is connected to the second edge measurement connection electrode 130E2 and the second center measurement connection electrode 130C2 to connect them, will be referred to as a second measurement conductive pattern 115. The second measurement conductive pattern 115 may have a line shape extending between the second edge measurement connection electrode 130E2 and the second center measurement connection electrode 130C2. Referring further to FIG. 3B, both ends of the second measurement conductive pattern 115 may be exposed by the openings that are formed in the insulating layer 140, and these exposed portions will be referred to as second measurement pads 115P. Among the second measurement pads 115P, a pad that is connected to the second edge measurement connection electrode 130E2 will be referred to as a second edge measurement pad 115PE, and a pad that is connected to the second center measurement connection electrode 130C2 will be referred to as a second center measurement pad 115PC.

The normal conductive pattern 113, the first measurement conductive pattern 114, and the second measurement conductive pattern 115 may be positioned at the same level in the vertical direction of FIG. 1B, that is, in the direction in which the thickness of the semiconductor chip 100 is measured. In addition, the normal conductive pattern 113, the first measurement conductive pattern 114, and the second measurement conductive pattern 115 may be physically and electrically separated from each other. Although there is no example of the shape of the normal conductive pattern 113 in the plan view of FIG. 1A, the first measurement conductive pattern 114 and the second measurement conductive pattern 115 may bypass the normal conductive pattern 113 to be electrically separated from the normal conductive pattern 113. To this end, the first measurement conductive pattern 114 and the second measurement conductive pattern 115 may have a line shape that is bent in various directions.

In the present embodiment, the normal connection electrode 120 and the measurement connection electrode 130 may be conductive bumps. In addition, in the present embodiment, the normal connection electrode 120 and the measurement connection electrode 130 may have a square shape in a plan view. For convenience of description, the thickness of the line of the square shape is shown differently. However, the present disclosure is not limited thereto, and the normal connection electrode 120 and the measurement connection electrode 130 may be conductors with various shapes. As an example, the normal connection electrode 120 and the measurement connection electrode 130 may be a solder bump or a metal pillar bump in which a solder layer is formed on a metal pillar.

Next, referring to FIG. 2, a substrate 200 of the present embodiment may be provided. The substrate 200 may be a substrate for a semiconductor package with a circuit and/or wiring structure for supplying power or transmitting signals. For example, the substrate 200 may be a printed circuit board (PCB).

Referring to FIGS. 1A, 1B, and 2 together, the substrate 200 may have a first surface 201 to face the first surface 111 of the semiconductor chip 100. Substrate pads 220 and 230 that electrically connect the connection electrodes 120 and 130 of the semiconductor chip 100 to the substrate 200 may be formed on the first surface 201 of the substrate 200. For reference, a substrate pad may mean an electrically conductive element or an electrically conductive terminal that is exposed through the first surface 201 of the substrate 200 in order to connect the substrate 200 with other components. Referring further to FIG. 3B, in the present embodiment, the substrate pads 220 and 230 may be buried in the substrate 200, and one surface of each of the substrate pads 220 and 230 may be positioned at the same level as the first surface 201 so as to be exposed. However, the present disclosure is not limited thereto. In another embodiment, some or all of the substrate pads 220 and 230 may protrude onto the first surface 201 of the substrate 200.

The substrate pads 220 and 230 may include a normal substrate pad 220 that is connected to the normal connection electrode 120 of the semiconductor chip 100, and a measurement substrate pad 230 that is connected to the measurement connection electrode 130 of the semiconductor chip 100.

The normal substrate pad 220 may be a part of a circuit and/or wiring structure of the substrate 200. As an example, the normal substrate pad 220 may be a bonding pad for flip chip bonding. A plurality of normal substrate pads 220 may be connected to the plurality of normal connection electrodes 120 in a one-to-one correspondence. Accordingly, the normal substrate pads 220 may be arranged in the same manner as the normal connection electrodes 120. For example, the normal substrate pads 220 may be arranged in two columns along the first direction, in the center of the substrate 200 in the second direction. In the present embodiment, in a plan view, the normal substrate pad 220 may have a bar shape with a short side in the first direction and a long side in the second direction. However, the present disclosure is not limited thereto. The planar shape of the normal substrate pad 220 may be variously modified to facilitate connection with the normal connection electrode 120. Although not shown, one end or both ends of the normal substrate pad 220 may be connected to a circuit and/or wiring structure of the substrate 200 to provide a path for transmitting a signal or supplying power.

The measurement substrate pad 230 may be formed separately from the normal substrate pad 220 and a circuit and/or wiring structure of the substrate 200 with the normal substrate pad 220. That is, the measurement substrate pad 230 may be electrically separated while being spaced apart from the circuit and/or wiring structure of the substrate 200. Further, the measurement substrate pad 230 may be formed of a material that is different from the normal substrate pad 220 or may be formed to have a thickness that is different from that of the normal substrate pad 220. As an example, the measurement substrate pad 230 may be a lead.

The measurement substrate pad 230 may include a first edge measurement substrate pad 230E1 that is connected to the first edge measurement connection electrode 130E1, a center measurement substrate pad 230C that is simultaneously connected to the first and second center measurement connection electrodes 130C1 and 130C2, and a second edge measurement substrate pad 230E2 that is connected to the second edge measurement connection electrode 130E2.

The center measurement substrate pad 230C may have a shape that overlaps the first and second center measurement connection electrodes 130C1 and 130C2 and connects them. As described above, the first and second center measurement connection electrodes 130C1 and 130C2 may be arranged to be spaced apart from each other in the first direction. Accordingly, the center measurement substrate pad 230C may have a bar shape with a long side in the first direction and a short side in the second direction.

The first edge measurement substrate pad 230E1 may have a bar shape with a long side in the second direction while overlapping the first edge measurement connection electrode 130E1. That is, the long side of the first edge measurement substrate pad 230E1 may be orthogonal to the long side of the center measurement substrate pad 230C. The second edge measurement substrate pad 230E2 may have a bar shape with a long side in the second direction while overlapping the second edge measurement connection electrode 130E2. That is, the long side of the second edge measurement substrate pad 230E2 may also be orthogonal to the long side of the center measurement substrate pad 230C. The reason for making the first and second edge measurement substrate pads 230E1 and 230E2 orthogonal to the center measurement substrate pad 230C may be to detect the misalignment between the semiconductor chip 100 and the substrate 200 and to detect the connection failure between the semiconductor chip and the substrate 200 that results therefrom. This will be described later with reference to FIGS. 4A to 4E.

Meanwhile, first and second measurement terminals 231 and 232 may be connected to the ends of the first and second edge measurement substrate pads 230E1 and 230E2, respectively. The first and second measurement terminals 231 and 232 may have a flat plate shape with a size that is relatively larger than that of a substrate pad in order to contact a probe for current detection or the like. In this case, the first and second measurement terminals 231 and 232 may be spaced apart from the first and second edge measurement substrate pads 230E1 and 230E2. This is because the positions of the first and second edge measurement substrate pads 230E1 and 230E2 are determined based on the positions of the first and second edge measurement connection electrodes 130E1 and 130E2 of the semiconductor chip 100, while the first and second measurement terminals 231 and 232 are formed in a region that does not overlap with the semiconductor chip 100 for contact with a probe or the like. In this case, a first extension portion 235 that extends from the first edge measurement substrate pad 230E1 to the first measurement terminal 231, and a second extension portion 236 that extends from the second edge measurement substrate pad 230E2 to the second measurement terminal 232 may be further formed. The first extension portion 235 and the second extension portion 236 may extend toward the first and second measurement terminals 231 and 232, regardless of the direction of the long sides of the first and second edge measurement substrate pads 230E1 and 230E2. In the present embodiment, the first extension portion 235 and the second extension portion 236 may extend in the first direction. The first extension portion 235 and the second extension portion 236 may be leads that are formed integrally with the first and second edge measurement substrate pads 230E1 and 230E2.

Next, referring to FIGS. 3A and 3B, the semiconductor chip 100 of FIGS. 1A and 1B may be mounted on the substrate 200 of FIG. 2. Because the semiconductor chip 100 is mounted on the substrate 200 with the first surface 111 that faces the substrate 200, the positions of the normal connection electrode 120 and the measurement connection electrode 130 in the second direction may be opposite to the related components of FIG. 1A. That is, the left and right positions of the normal connection electrode 120 and the measurement connection electrode 130 may be reversed.

The normal connection electrode 120 of the semiconductor chip 100 may be connected to a corresponding normal substrate pad 220 of the substrate 200. The measurement connection electrode 130 of the semiconductor chip 100 may be connected to a corresponding measurement substrate pad 230 of the substrate 200. More specifically, the first edge measurement connection electrode 130E1 may be connected to the first edge measurement substrate pad 230E1, the first and second center measurement connection electrodes 130C1 and 130C2 may be simultaneously connected to the center measurement substrate pad 230C, and the second edge measurement connection electrode 130E2 may be connected to the second edge measurement substrate pad 230E2.

Here, the first edge measurement connection electrode 130E1 and the first center measurement connection electrode 130C1 may be connected to each other by the first measurement conductive pattern 114, and the second edge measurement connection electrode 130E2 and the second center measurement connection electrode 130C2 may be connected to each other by the second measurement conductive pattern 115. As a result, A daisy chain connection structure of the first measurement terminal 231, the first extension portion 235, the first edge measurement substrate pad 230E1, the first edge measurement connection electrode 130E1, the first measurement conductive pattern 114, the first center measurement connection electrode 130C1, the center measurement substrate pad 230C, the second center measurement connection electrode 130C2, the second measurement conductive pattern 115, the second edge measurement connection electrode 130E2, the second edge measurement substrate pad 230E2, the second extension portion 236, and the second measurement terminal 232 may be formed. It may be determined whether a current flow through this connection structure (refer to the dotted arrow in FIG. 3B) is formed. If the current flow is formed, it may be detected that the connection between the semiconductor chip 100 and the substrate 200, more specifically, the connection between the normal connection electrode 120 and the normal substrate pad 220 is normally made. On the other hand, if the current flow is not formed, it may be detected that the connection between the semiconductor chip 100 and the substrate 200 is not normally made.

Based on the embodiment described above, in a state in which the connection electrodes 120 and 130 of the semiconductor chip 100 are connected to the substrate pads 220 and 230 of the substrate 200, it may be possible to detect a connection failure between the semiconductor chip 100 and the substrate 200. Therefore, failure detection may be facilitated, and failure detection cost may be minimized. In addition, when there are a plurality of semiconductor chips 100, it may be possible to detect failure of all of the plurality of semiconductor chips 100, instead of detecting failure by sampling.

Meanwhile, in the present embodiment, the first edge measurement substrate pad 230E1 and the second edge measurement substrate pad 230E of the substrate 200 may have the long sides in the second direction, while the center measurement substrate pad 230C has the long side in the first direction. In this case, even if misalignment occurs in any direction between the semiconductor chip 100 and the substrate 200, all connection failures between the semiconductor chip 100 and the substrate 200 due to this misalignment may be detected. This will be described with reference to FIGS. 4A to 4E.

FIGS. 4A to 4E are views, illustrating alignment between the semiconductor chip 100 and the substrate 200. For convenience of description, in these figures, the outline of the semiconductor chip 100, the outline of the substrate 200, the measurement connection electrodes 130E1, 130C1, 130C2, and 130E2, and the measurement substrate pads 230E1, 230C, and 230E2 are shown.

Figure 4A:
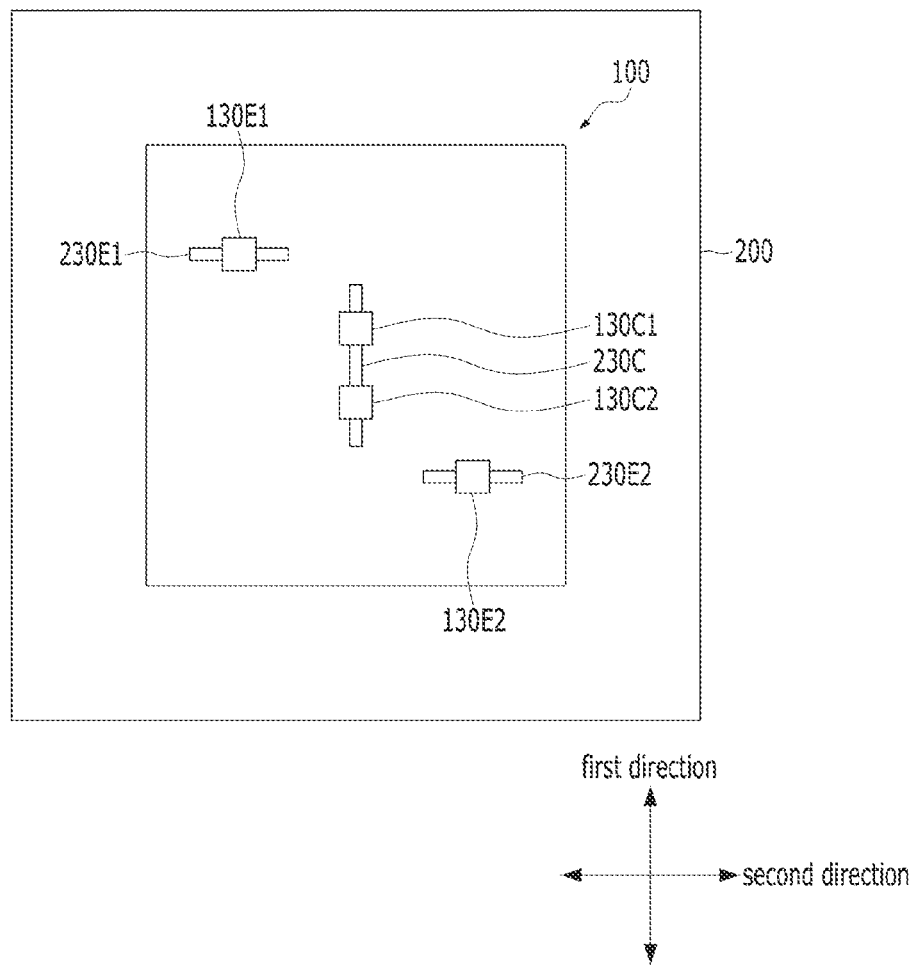
FIGS. 4A to 4E are views, illustrating an alignment between the semiconductor chip 100 and the substrate 200.

FIG. 4A illustrates a case where the semiconductor chip 100 and the substrate 200 are normally aligned. In this case, the first edge measurement connection electrode 130E1 may be connected to the first edge measurement substrate pad 230E1, the first and second center measurement connection electrodes 130C1 and 130C2 may be simultaneously connected to the center measurement substrate pad 230C, and the second edge measurement connection electrode 130E2 may be connected to the second edge measurement substrate pad 230E2.

Figure 4B:
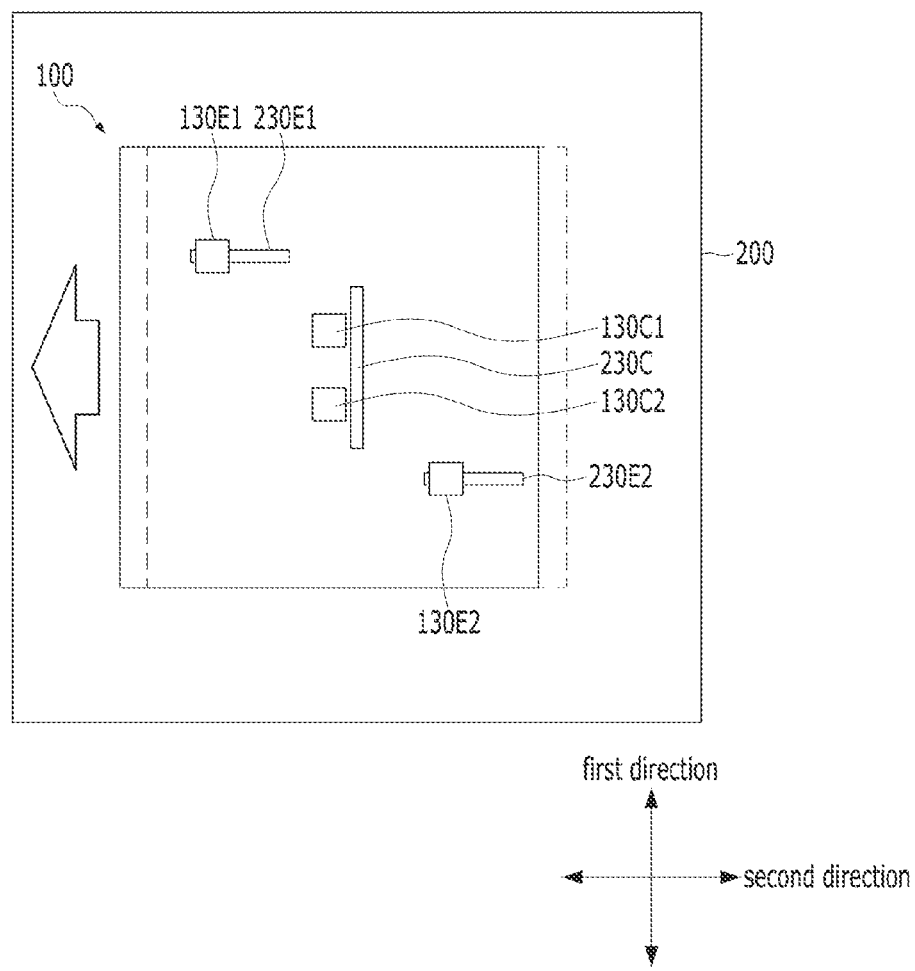

FIG. 4B illustrates a case where the semiconductor chip 100 moves to one side in the second direction, for example, to the left side, and is misaligned with the substrate 200. In this case, the first edge measurement connection electrode 130E1 may be connected to the first edge measurement substrate pad 230E1, and the second edge measurement connection electrode 130E2 may be connected to the second edge measurement substrate pad 230E2. This is because the first edge measurement substrate pad 230E1 and the second edge measurement substrate pad 230E2 have the long sides in the second direction. Even if the first edge measurement connection electrode 130E1 and the second edge measurement connection electrode 130E2 are moved by a predetermined degree in the second direction, the connection between the first edge measurement connection electrode 130E1 and the first edge measurement substrate pad 230E1, and the connection between the second edge measurement connection electrode 130E2 and the second edge measurement substrate pad 230E2 may be maintained.

On the other hand, the first and second center measurement connection electrodes 130C1 and 130C2 might not be connected to the center measurement substrate pad 230C. This is because the center measurement substrate pad 230C has the short side in the second direction.

In this case, because the daisy chain connection structure that is described above is cut off at a center, a current flow through the connection structure cannot be generated. As a result, misalignment and connection failure between the semiconductor chip 100 and the substrate 200 may be detected.

Figure 4C:
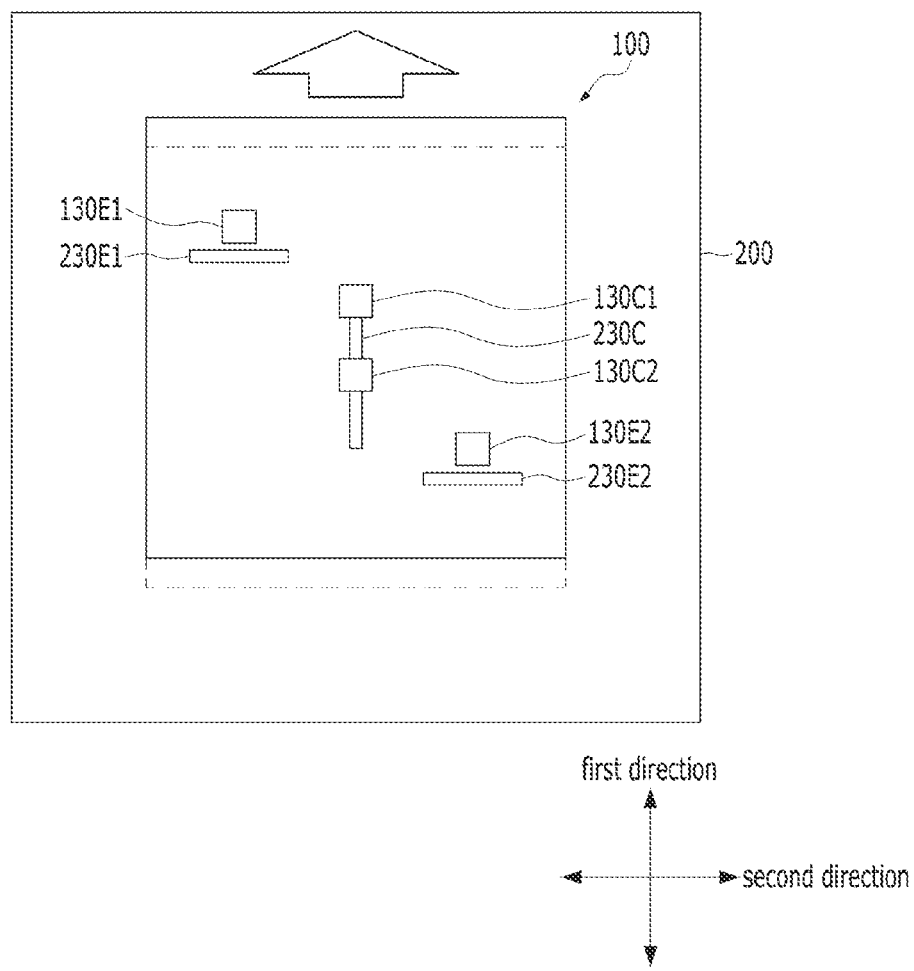

FIG. 4C illustrates a case where the semiconductor chip 100 moves to one side in the first direction (for example, to the upper side) and is misaligned with the substrate 200. In this case, the first and second center measurement connection electrodes 130C1 and 130C2 may be connected to the center measurement substrate pad 230C. This is because the center measurement substrate pad 230C has the long side in the first direction. Even if the first and second center measurement connection electrodes 130C1 and 130C2 move by a predetermined degree in the first direction, the connection between the first and second center measurement connection electrodes 130C1 and 130C2 and the center measurement substrate pad 230C may be maintained.

On the other hand, the first edge measurement connection electrode 130E1 and the first edge measurement substrate pad 230E1 might not be connected, and the second edge measurement connection electrode 130E2 and the second edge measurement substrate pad 230E2 might not be connected. This is because the first edge measurement substrate pad 230E1 and the second edge measurement substrate pad 230E2 have the short sides in the first direction.

In this case, because the daisy chain connection structure described above is cut off at an edge, a current flow through the connection structure cannot be generated. As a result, misalignment and connection failure between the semiconductor chip 100 and the substrate 200 may be detected.

Figure 4D:
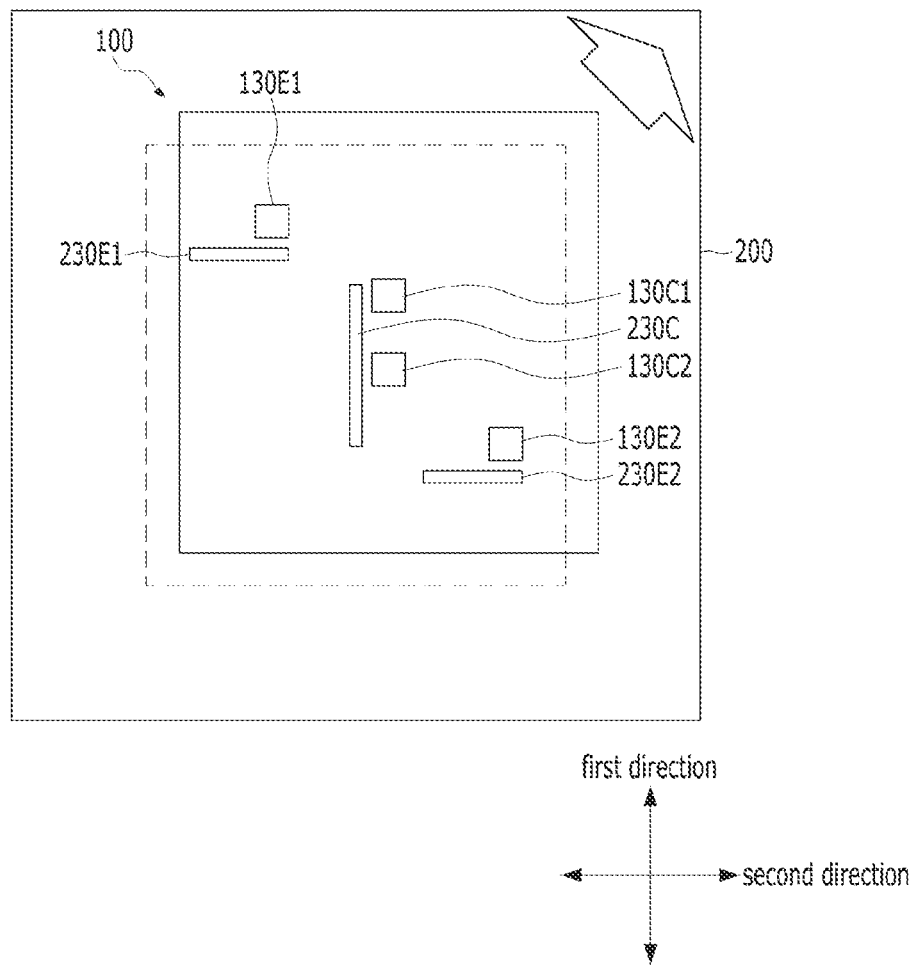

FIG. 4D illustrates a case where the semiconductor chip 100 moves in a diagonal direction with respect to the first direction and the second direction (for example, in a direction toward the right and upper sides) and is misaligned with the substrate 200. In this case, the first and second center measurement connection electrodes 130C1 and 130C2 might not be connected to the center measurement substrate pad 230C, the first edge measurement connection electrode 130E1 might not be connected to the first edge measurement substrate pad 230E1, and the second edge measurement connection electrode 130E2 might not be connected to the second edge measurement substrate pad 230E2.

In this case, because the daisy chain connection structure, described above, is cut off at the center and the edge, a current flow through the connection structure cannot be generated. As a result, misalignment and connection failure between the semiconductor chip 100 and the substrate 200 may be detected.

Figure 4E:
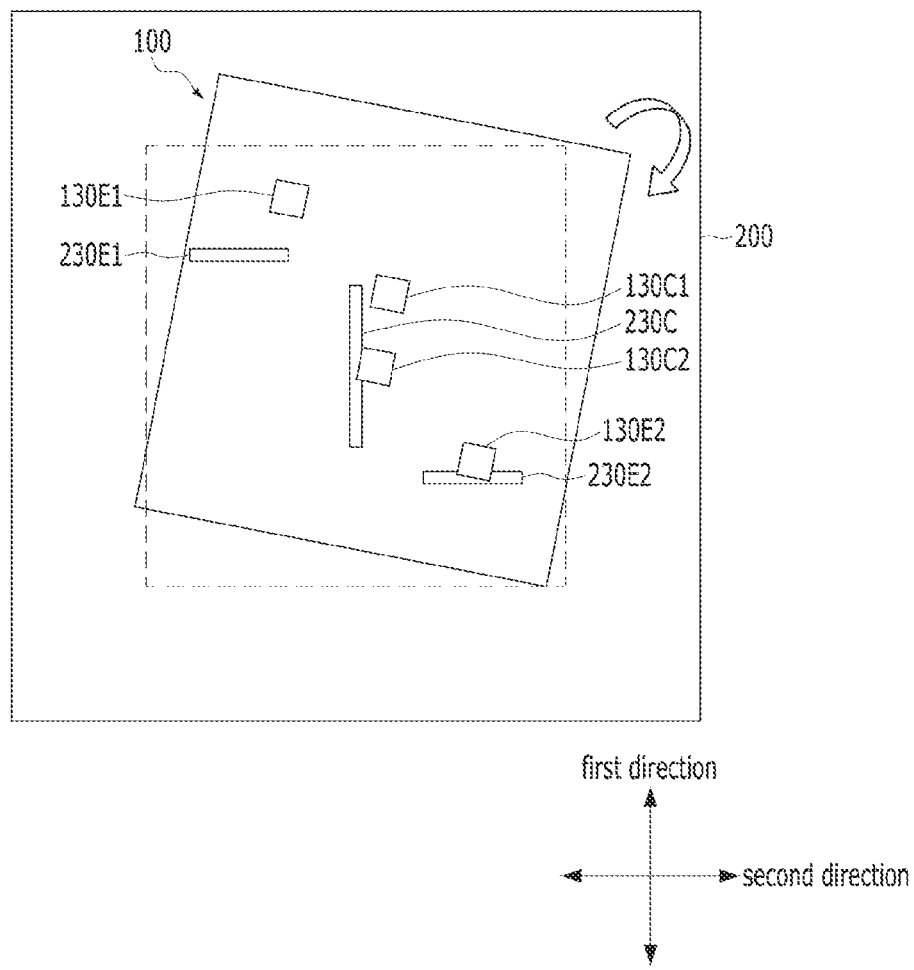

FIG. 4E illustrates a case where the semiconductor chip 100 is rotated at a predetermined angle and is misaligned with the substrate 200. In this case, at least one of the connections between the first and second center measurement connection electrodes 130C1 and 130C2 and the center measurement substrate pad 230C, the connection between the first edge measurement connection electrode 130E1 and the first edge measurement substrate pad 230E1, and the connection between the second edge measurement connection electrode 130E2 and the second edge measurement substrate pad 230E2 might not be made.

In this case, because the daisy chain connection structure described is cut off at a portion where no connection is made, a current flow through this connection structure cannot be generated. As a result, misalignment and connection failure between the semiconductor chip 100 and the substrate 200 may be detected. Furthermore, the type of misalignment that occurs between the semiconductor chip 100 and the substrate 200 may be determined.

Meanwhile, the wiring layer L1 that is described in the embodiment of FIGS. 1A to 3B may be formed in a state in which a wafer in which a circuit pattern is formed is fab-out, that is, during a packaging process. Alternatively, the wiring layer L1 may be formed in a front-end process in which the circuit pattern is formed in the wafer, together with the circuit pattern. Hereinafter, a case where the wiring layer L1 is formed in the front-end process will be exemplarily described.

Figure 5A:
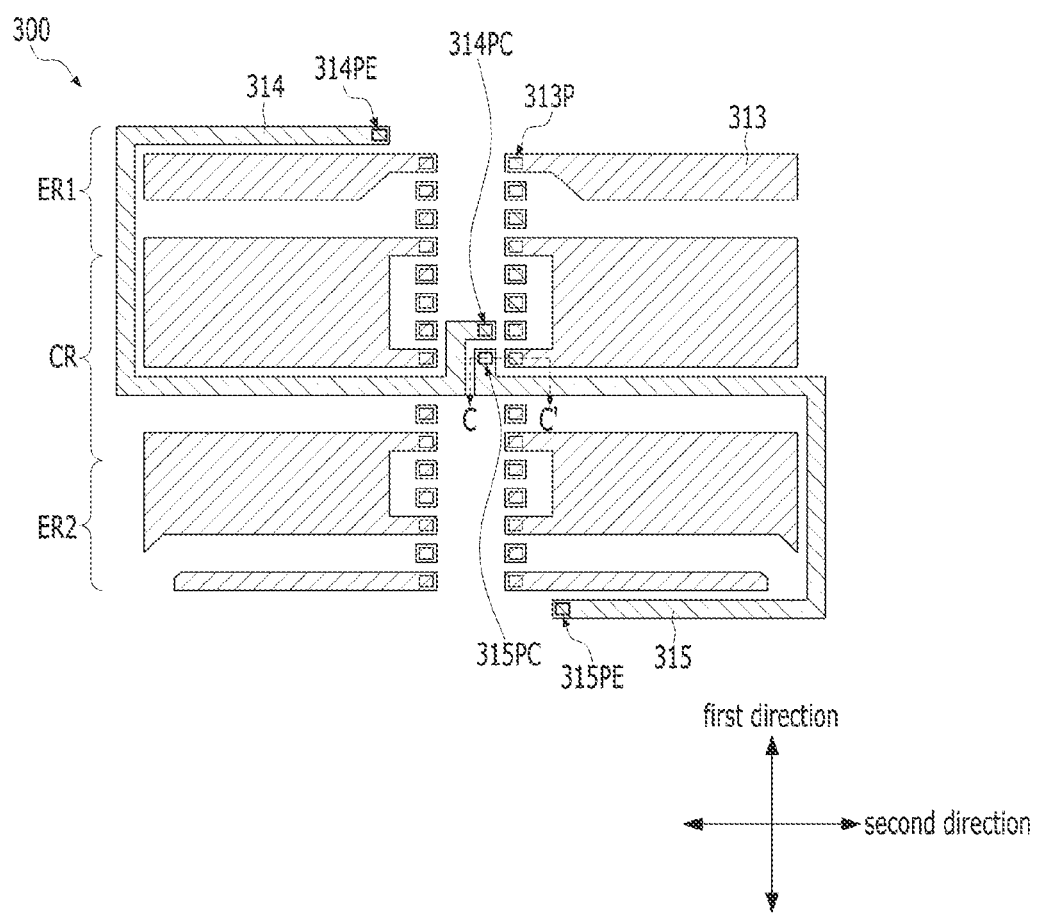
FIG. 5A is a plan view, illustrating a semiconductor chip of a semiconductor package, according to another embodiment of the present disclosure.
Figure 5B:
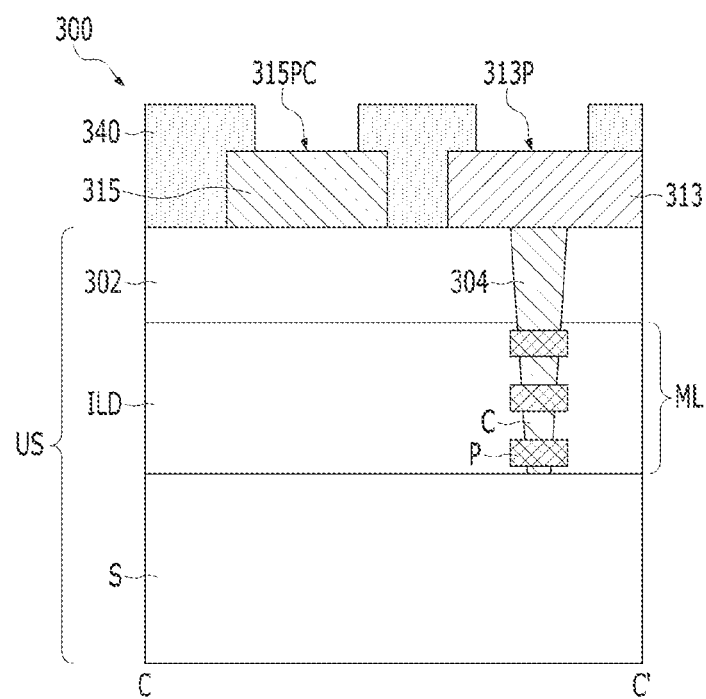
FIG. 5B is a cross-sectional view that is taken along a line C-C' of FIG. 5A.

FIG. 5A is a plan view, illustrating a semiconductor chip of a semiconductor package, according to another embodiment of the present disclosure, and FIG. 5B is a cross-sectional view that is taken along a line C-C' of FIG. 5A.

Referring to FIGS. 5A and 5B, a semiconductor chip 300 of the present embodiment may include a lower structure US, redistribution conductive layers 313, 314, and 315 that are formed over the lower structure US, and a protective layer 340 covering the lower structure US and the redistribution conductive layers 313, 314, and 315 while exposing portions of the redistribution conductive layers 313, 314, and 315. Here, the redistribution conductive layers 313, 314, and 315 may correspond to the wiring layer L1 of the above-described embodiment, and the protective layer 340 may correspond to the insulating layer 140 of the above-described embodiment.

The lower structure US may include a semiconductor substrate S with a semiconductor material, such as silicon, a multi-layered conductive pattern ML that is formed on one surface of the semiconductor substrate S to constitute an integrated circuit, and an interlayer insulating layer ILD in which the multi-layered conductive pattern ML is buried. Although not shown, the interlayer insulating layer ILD may also have a multi-layered structure.

The multi-layered conductive pattern ML may include a plurality of conductors that are arranged in multiple layers in a direction that is perpendicular to the upper surface of the semiconductor substrate S and with various shapes. For example, the multi-layered conductive pattern ML may include a combination of a contact plug C and a pad P. The multi-layered conductive pattern ML may be connected to a part of the semiconductor substrate S, such as a junction of a transistor.

Materials for forming the multi-layered conductive pattern ML and the interlayer insulating layer ILD may be appropriately selected in order to satisfy the required characteristics of the semiconductor chip. As an example, at least a portion of the multi-layered conductive pattern ML may include a metal with a low resistance, such as copper (Cu). Also, as an example, at least a portion of the interlayer insulating layer ILD may include a material with a low dielectric constant, such as a low-k material with a dielectric constant of 2.7 or less.

However, if the semiconductor chip in which the multi-layered conductive pattern ML and the interlayer insulating layer ILD are formed is covered with a protective layer and then fab-out to be packaged, moisture will penetrate through a low-k material that is relatively vulnerable to moisture absorption. The moisture may cause electrical movement of metal ions, particularly copper ions, and thus, a loss of the multi-layered conductive pattern ML or an electrical short with another adjacent conductor may occur. Accordingly, in the semiconductor chip 300 of the present embodiment, by forming a thick insulating layer 302 on the interlayer insulating layer ILD, the penetration of moisture may be prevented.

The insulating layer 302 may include an insulating material with a higher dielectric constant and/or a lower moisture absorption than a low-k material, such as silicon oxide, silicon nitride, or a combination thereof. In addition, the insulating layer 302 may have a single-layered structure or a multi-layered structure. The insulating layer 302 may be formed relatively thick to prevent moisture penetration. The insulating layer 302 may be thicker than any one layer of the interlayer insulating layer ILD with a multi-layered structure. For example, the insulating layer 302 may have a thickness of tens of thousands of Å.

However, because it is necessary to connect the multi-layered conductive pattern ML to an external component, a contact plug 304 penetrating the insulating layer 302 and connected to the multi-layered conductive pattern ML, and the redistribution conductive layer 313 that is formed over the insulating layer 302 and connected to the contact plug 304 may be further formed.

The redistribution conductive layers 313, 314, and 315 may include various conductive materials, such as the metal aluminum (Al), and may have a single-layered structure or a multi-layered structure. In addition, the redistribution conductive layers 313, 314, and 315 may be formed to be relatively thick for smooth signal transmission and balance with the insulating layer 302. The redistribution conductive layers 313, 314, and 315 may have the same thickness as or a similar thickness to the thickness of the insulating layer 302. For example, redistribution conductive layers 313, 314, and 315 may have a thickness of tens of thousands of Å.

The protective layer 340 may be disposed over the redistribution conductive layers 313, 314, and 315. The protective layer 340 may define redistribution pads 313P, 314PC, 314PE, 315PC, and 315PE by exposing portions of the redistribution conductive layers 313, 314, 315 while protecting the semiconductor chip 300. The protective layer 340 may have a single-layered structure or a multi-layered structure with various insulating materials, such as an insulating polymer. In particular, the protective layer 340 may include a polyimide material, such as Polyimide Isoindro Quindzoline (PIQ).

All of the process of forming the lower structure US, the process of forming the redistribution conductive layers 313, 314, and 315, and the process of forming the protective layer 340 may be performed before fab-out, that is, in the front-end process. As an example, the lower structure US and the redistribution conductive layers 313, 314, and 315 may be formed by repeating a deposition process of a conductive material or an insulating material, and a mask and etching process. The protective layer 340 may be formed by a coating method.

The redistribution conductive layers 313, 314, and 315 may include a normal redistribution conductive layer 313, a first measurement redistribution conductive layer 314, and a second measurement redistribution conductive layer 315. The normal redistribution conductive layer 313, the first measurement redistribution conductive layer 314, and the second measurement redistribution conductive layer 315 may correspond to the normal conductive pattern 113, the first measurement conductive pattern 114, and the second measurement conductive pattern 115 of the above-described embodiment, respectively.

The normal redistribution conductive layer 313 may be formed over the entire surface of the lower structure US and may have various planar shapes based on patterning. The normal redistribution conductive layer 313 may be electrically connected to the multi-layered conductive pattern ML. A portion of the normal redistribution conductive layer 313 that is exposed by the opening of the protective layer 340 will be referred to as a normal redistribution pad 313P. As an example, the normal redistribution pad 313P may be disposed in a center region of the semiconductor chip 300 in the second direction. Also, a plurality of normal redistribution pads 313P may be arranged in two columns along the first direction.

The normal redistribution pads 313P to which the same power is applied among the plurality of normal redistribution pads 313P may be connected to each other using the normal redistribution conductive layer 313. This is for effective supply of power required during the operation of the semiconductor chip 300. To this end, the normal redistribution conductive layer 313 may include an overlapping portion overlapping each of two or more normal redistribution pads 313P to which the same power is applied, and a flat plate portion that connects the overlapping portions to each other to form one flat plate. The normal redistribution conductive layer 313 that is connected to one of the two columns of normal redistribution pads 313P, such as the left column of normal redistribution pads 313P, may include a flat plate extending to the left region of the semiconductor chip 300. In addition, the normal redistribution conductive layer 313 that is connected to the other one of the two columns of normal redistribution pads 313P, such as the right column of normal redistribution pads 313P, may include a flat plate extending to the right region of the semiconductor chip 300. These normal redistribution conductive layers 313 may extend to both side edges of the semiconductor chip 300 in the second direction.

The first measurement redistribution conductive layer 314 and the second measurement redistribution conductive layer 315 might not be connected to the multi-layered conductive pattern ML. In other words, under the first measurement redistribution conductive layer 314 and the second measurement redistribution conductive layer 315, an electrically conductive element that is connected to them might not exist. A portion of the first measurement redistribution conductive layer 314 that is exposed by the protective layer 340 will be referred to as a first measurement redistribution pad 314PC and 314PE, and a portion of the second measurement redistribution conductive layer 315 that is exposed by the protective layer 340 will be referred to as a second measurement redistribution pad 315PC and 315PE. The first measurement redistribution pads 314PC and 314PE may include a first edge measurement redistribution pad 314PE and a first center measurement redistribution pad 314PC. The second measurement redistribution pads 315PC and 315PE may include a second edge measurement redistribution pad 315PE and a second center measurement redistribution pad 315PC. The first edge measurement redistribution pad 314PE may be disposed in the first edge region ER1 in the first direction and may be disposed at the left side of the left column of normal redistribution pads 313P in the second direction. The first and second center measurement redistribution pads 314PC and 315PC may be disposed in the center region CR in the first direction, and may be disposed between the left column of normal redistribution pads 313P and the right column of normal redistribution pads 313P in the second direction. The second edge measurement redistribution pad 315PE may be disposed in the second edge region ER2 in the first direction and may be disposed at the right side of the right column of normal redistribution pads 313P in the second direction.

The first measurement redistribution conductive layer 314 may have a line shape that connects the first edge measurement redistribution pad 314PE and the first center measurement redistribution pad 314PC. At this time, because the normal redistribution conductive layer 313 includes a flat plate that covers the left region of the semiconductor chip 300, the first measurement redistribution conductive layer 314 may be spaced apart from the normal redistribution conductive layer 313 and may bypass the normal redistribution conductive layer 313. For example, the first measurement redistribution conductive layer 314 may surround the normal redistribution conductive layer 313 from the first center measurement redistribution pad 314PC to the first edge measurement redistribution pad 314PE while passing the left edge of semiconductor chip 300 in the second direction.

In addition, the second measurement redistribution conductive layer 315 may have a line shape that connects the second edge measurement redistribution pad 315PE and the second center measurement redistribution pad 315PC. At this time, because the normal redistribution conductive layer 313 includes a flat plate covering the right region of the semiconductor chip 300, the second measurement redistribution conductive layer 315 may be spaced apart from the normal redistribution conductive layer 313 and bypass the normal redistribution conductive layer 313. For example, the second measurement redistribution conductive layer 315 may surround the normal redistribution conductive layer 313 from the second center measurement redistribution pad 315PC to the second edge measurement redistribution pad 315PE while passing the right edge of the semiconductor chip 300 in the second direction.

Based on the present embodiment, in addition to the advantages of the above-described embodiment, it may have the following advantages.

Because the relatively thick insulating layer 302 is formed on the multi-layered conductive pattern ML and the interlayer insulating layer ILD, moisture penetration into the semiconductor chip 300 may be prevented even if the multi-layered conductive pattern ML and the interlayer insulating layer ILD include a low-k material that is vulnerable to hygroscopicity and a metal such as copper, which is ionized by moisture and moves easily. As a result, reliability of the semiconductor chip 300 may be secured.

In addition, by using the normal redistribution conductive layer 313 to connect the normal redistribution pads 313P to which the same power is applied to each other, effective power supply may be possible. As a result, it may be possible to improve the operating characteristics of the semiconductor chip 300.

Meanwhile, in the embodiment of FIGS. 1A to 3B described above, because the first and second center measurement connection electrodes 130C1 and 130C2 are arranged in the first direction, the long side of the center measurement substrate pad 230C that is connected thereto is also arranged in the first direction. In addition, the first and second edge measurement substrate pads 230E1 and 230E2 have their long sides disposed in the second direction so as to be orthogonal to the center measurement substrate pad 230C. However, the present disclosure is not limited thereto, and various embodiments may be possible as long as a center measurement substrate pad is connected to two center measurement connection electrodes that are disposed in a center region and crosses first and second edge measurement substrate pads at a predetermined angle.

Figure 6:
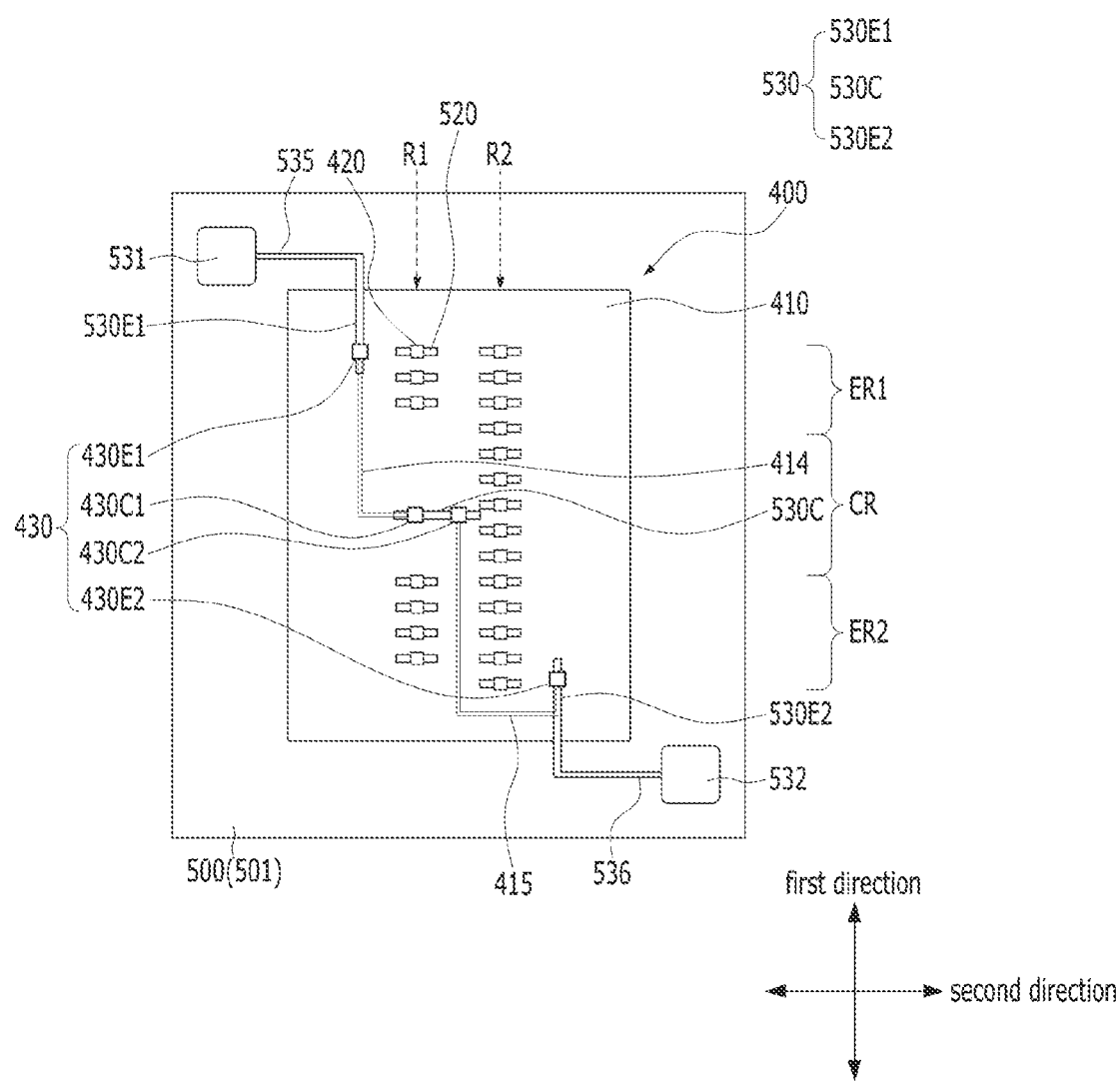
FIG. 6 is a plan view, illustrating a semiconductor package, according to another embodiment of the present disclosure.

FIG. 6 is a plan view, illustrating a semiconductor package, according to another embodiment of the present disclosure. A description will be made that focuses on differences from the embodiment of FIGS. 1 to 3B.

Referring to FIG. 6, a semiconductor chip 400 may be mounted on a substrate 500.

The semiconductor chip 400 may include a body portion 410 and a normal connection electrode 420 and a measurement connection electrode 430 that is formed on one surface of the body portion 410.

A plurality of normal connection electrodes 420 may be arranged in a first column R1 and a second column R2 in a plan view. In the first direction, both edge regions of a region in which the plurality of normal connection electrodes 420 are arranged will be referred to as a first edge region ER1 and a second edge region ER2, respectively, and a region between the first edge region ER1 and the second edge region ER2 will be referred to as a center region CR.

The measurement connection electrode 430 may be disposed to be adjacent to the normal connection electrode 420, and may be disposed by considering the regions of the first semiconductor chip 400. For example, the measurement connection electrode 430 may include a first edge measurement connection electrode 430E1 that is disposed in the first edge region ER1, first and second center measurement connection electrodes 430C1 and 430C2 that are disposed in the center region CR, and a second edge measurement connection electrode 430E2 that is disposed in the second edge region ER2. In this case, unlike the above-described embodiment, the first and second center measurement connection electrodes 130C1 and 130C2 may be arranged at a predetermined interval along the second direction.

The first edge measurement connection electrode 430E1 and the first center measurement connection electrode 430C1 may be connected by a first measurement conductive pattern 414. The second edge measurement connection electrode 430E2 and the second center measurement connection electrode 430C2 may be connected by a second measurement conductive pattern 415.

The substrate 500 may have a first surface 501 that faces the normal connection electrode 420 and the measurement connection electrode 430 of the semiconductor chip 400. On the first surface 501 of the substrate 500, a normal substrate pad 520 and a measurement substrate pad 530 respectively connected to the normal connection electrode 420 and the measurement connection electrode 430 of the semiconductor chip 400 may be formed.

The normal substrate pads 520 may be connected to the normal connection electrodes 420 in a one-to-one correspondence.

The measurement substrate pad 530 may include a first edge measurement substrate pad 530E1 that is connected to the first edge measurement connection electrode 430E1, a center measurement substrate pad 530C that is simultaneously connected with the first and second center measurement connection electrodes 430C1 and 430C2, and a second edge measurement substrate pad 530E2 that is connected to the second edge measurement connection electrode 430E2.

The center measurement substrate pad 530C may have a shape that overlaps the first and second center measurement connection electrodes 430C1 and 430C2 and connects them. As described above, the first and second center measurement connection electrodes 430C1 and 430C2 may be arranged to be spaced apart from each other in the second direction. Accordingly, the center measurement substrate pad 530C may have a bar shape with a long side in the second direction and a short side in the first direction.

The first edge measurement substrate pad 530E1 may have a bar shape with a long side in the first direction while overlapping the first edge measurement connection electrode 430E1. That is, the long side of the first edge measurement substrate pad 530E1 may be orthogonal to the long side of the center measurement substrate pad 530C. The second edge measurement substrate pad 530E2 may have a bar shape with a long side in the first direction while overlapping the second edge measurement connection electrode 430E2. That is, the long side of the second edge measurement substrate pad 530E2 may also be orthogonal to the long side of the center measurement substrate pad 530C.

First and second measurement terminals 531 and 532 may be connected to the ends of the first and second edge measurement substrate pads 530E1 and 530E2, respectively. Further, a first extension portion 535 that extends from the first edge measurement substrate pad 530E1 to the first measurement terminal 531, and a second extension portion 536 that extends from the second edge measurement substrate pad 530E2 to the second measurement terminal 532 may be further formed.

Based on the embodiments of the present disclosure, connection failure between a semiconductor chip and a substrate may be easily and accurately detected.

Figure 7:
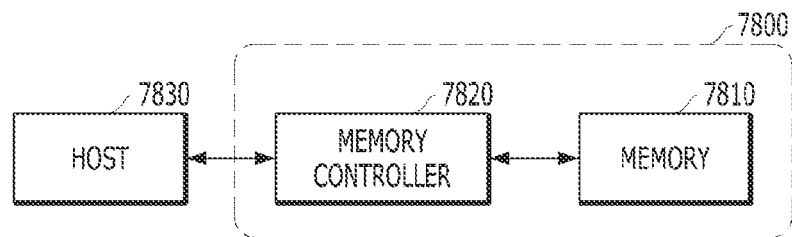
FIG. 7 shows a block diagram illustrating an electronic system employing a memory card including a semiconductor package, according to an embodiment.

FIG. 7 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 8:
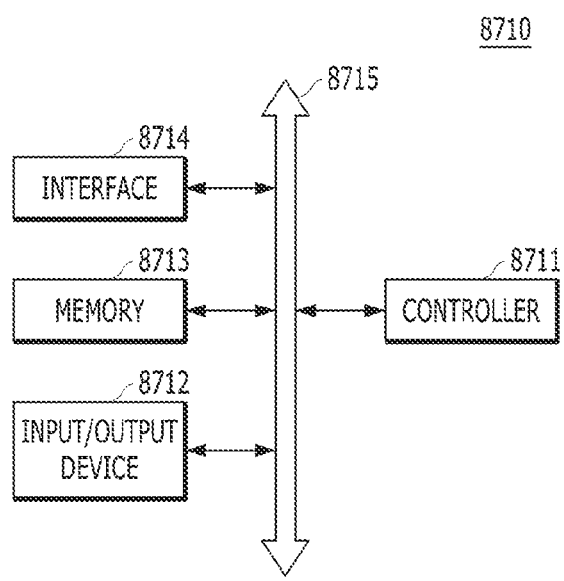
FIG. 8 shows a block diagram illustrating another electronic system including a semiconductor package, according to an embodiment.

FIG. 8 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the disclosure as defined in the following claims.

What is claimed is:

1. A semiconductor package, comprising:
a semiconductor chip including a normal connection electrode and a measurement connection electrode that are formed on a first surface; and
a substrate including a normal substrate pad that is connected to the normal connection electrode and a measurement substrate pad that is connected to the measurement connection electrode, the normal substrate pad and the measurement substrate pad being formed on a surface that faces the first surface,
wherein the measurement connection electrode includes first and second edge measurement connection electrodes that are formed at both side edge regions of the semiconductor chip, respectively, where the side edge regions run along a first direction, and first and second center measurement connection electrodes that are arranged in a center region of the semiconductor chip to be spaced apart from each other, where the center region is disposed between the both side edge regions in the first direction,
wherein the measurement substrate pad includes a center measurement substrate pad with a long side in an arrangement direction of the first and second center measurement connection electrodes to simultaneously connect the first and second center measurement connection electrodes, a first edge measurement substrate pad with a long side crossing that of the center measurement substrate pad while being connected to the first edge measurement connection electrode, and a second edge measurement substrate pad with a long side crossing that of the center measurement substrate pad while being connected to the second edge measurement connection electrode,
wherein the first edge measurement connection electrode and the first center measurement connection electrode are electrically connected to each other, and the second edge measurement connection electrode and the second center measurement connection electrode are electrically connected to each other,
wherein the substrate further includes:
a first measurement terminal electrically connected to the first edge measurement substrate pad; and
a second measurement terminal electrically connected to the second edge measurement substrate pad, and
wherein an electrical path is formed to pass through the first measurement terminal, the first edge measurement substrate pad, the first edge measurement connection electrode, the first center measurement connection electrode, the center measurement substrate pad, the second center measurement connection electrode, the second edge measurement connection electrode, the second edge measurement substrate pad, and the second measurement terminal.

2. The semiconductor package according to claim 1, wherein, when the first edge measurement substrate pad and the first measurement terminal are spaced apart from each other, the substrate further includes a first connection portion that connects the first edge measurement substrate pad to the first measurement terminal.

3. The semiconductor package according to claim 1, wherein, when the second edge measurement substrate pad and the second measurement terminal are spaced apart from each other, the substrate further includes a second connection portion that connects the second edge measurement substrate pad to the second measurement terminal.

4. The semiconductor package according to claim 1, wherein the semiconductor chip further includes a first measurement conductive pattern that connects the first edge measurement connection electrode to the first center measurement connection electrode, and a second measurement conductive pattern that connects the second edge measurement connection electrode to the second center measurement connection electrode.

5. The semiconductor package according to claim 4,
wherein the semiconductor chip includes a plurality of wiring layers that are arranged in a third direction, where the third direction is in a direction of a thickness of the semiconductor chip,
wherein the normal connection electrode is connected to a normal conductive pattern, where the normal conductive pattern is part of the plurality of wiring layers, which is closest to the first surface of the semiconductor chip.

6. The semiconductor package according to claim 5, wherein the first measurement conductive pattern and the second measurement conductive pattern are positioned at the same level as the normal conductive pattern in the third direction.

7. The semiconductor package according to claim 6, wherein the first measurement conductive pattern and the second measurement conductive pattern are physically and electrically separated from the normal conductive pattern.

8. The semiconductor package according to claim 1,
wherein the normal connection electrode includes a first column of normal connection electrodes that are arranged in a line along the first direction, and a second column of normal connection electrodes that are arranged in a line along the first direction, the first column of normal connection electrodes being spaced apart from the second column of normal connection electrodes in a second direction that is orthogonal to the first direction,
wherein the first edge measurement connection electrode and the second edge measurement connection electrode are respectively disposed at both sides of the first and second columns of normal connection electrodes in the second direction, and
wherein the first and second center measurement connection electrodes are disposed between the first column of normal connection electrodes and the second column of normal connection electrodes in the second direction.

9. The semiconductor package according to claim 8, wherein the first and second columns of normal connection electrodes are disposed in a center region of the semiconductor chip in the second direction.

10. The semiconductor package according to claim 1,
wherein the semiconductor chip includes a lower structure with a multi-layered conductive pattern, and a redistribution conductive layer that is disposed over the lower structure, and
wherein the redistribution conductive layer includes a normal redistribution conductive layer that is connected to the normal connection electrode, and a measurement redistribution conductive layer that is connected to the measurement connection electrode.

11. The semiconductor package according to claim 10,
wherein the normal redistribution conductive layer is electrically connected to the multi-layered conductive pattern, and
wherein the measurement redistribution conductive layer is electrically insulated from the multi-layered conductive pattern.

12. The semiconductor package according to claim 10, wherein the measurement redistribution conductive layer includes a first measurement redistribution conductive layer that connects the first edge measurement connection electrode to the first center measurement connection electrode, and a second measurement redistribution conductive layer that connects the second edge measurement connection electrode to the second center measurement connection electrode.

13. The semiconductor package according to claim 10, wherein the normal redistribution conductive layer includes overlapping portions that overlap the normal connection electrodes to which the same power is applied, respectively, and a plate portion that connects the overlapping portions.

14. The semiconductor package according to claim 13, wherein the measurement redistribution conductive layer is shaped to surround the plate portion while being spaced apart from the normal redistribution conductive layer.

15. The semiconductor package according to claim 1, wherein the normal connection electrode and the measurement connection electrode include a conductive bump.

16. The semiconductor package according to claim 1,
wherein the first and second center measurement connection electrodes are arranged in the first direction, and
wherein each of the first and second edge measurement substrate pads has the long side that extends in a second direction, the second direction being orthogonal to the first direction.

17. The semiconductor package according to claim 1,
wherein the first and second center measurement connection electrodes are arranged in a second direction, the second direction being orthogonal to the first direction, and
wherein each of the first and second edge measurement substrate pads has the long side that extends in the first direction.

18. A semiconductor package, comprising:
a semiconductor chip including a normal connection electrode and a measurement connection electrode that are formed on a first surface; and
a substrate including a normal substrate pad that is connected to the normal connection electrode and a measurement substrate pad that is connected to the measurement connection electrode, the normal substrate pad and the measurement substrate pad being formed on a surface that faces the first surface,
wherein the measurement connection electrode includes first and second edge measurement connection electrodes that are formed at both side edge regions of the semiconductor chip, respectively, where the side edge regions run along a first direction, and first and second center measurement connection electrodes that are arranged in a center region of the semiconductor chip to be spaced apart from each other, where the center region is disposed between the both side edge regions in the first direction,
wherein the measurement substrate pad includes a center measurement substrate pad with a long side in an arrangement direction of the first and second center measurement connection electrodes to simultaneously connect the first and second center measurement connection electrodes, a first edge measurement substrate pad with a long side crossing that of the center measurement substrate pad while being connected to the first edge measurement connection electrode, and a second edge measurement substrate pad with a long side crossing that of the center measurement substrate pad while being connected to the second edge measurement connection electrode, and wherein the first edge measurement connection electrode and the first center measurement connection electrode are electrically connected to each other, and the second edge measurement connection electrode and the second center measurement connection electrode are electrically connected to each other, wherein the substrate further includes:

a first measurement terminal electrically connected to the first edge measurement substrate pad; and a second measurement terminal electrically connected to the second edge measurement substrate pad, wherein a determination is made on whether the normal connection electrode of the semiconductor chip is connected to the normal substrate pad of the substrate based on whether a current path, including the first measurement terminal, the first edge measurement substrate pad, the first edge measurement connection electrode, the first center measurement connection electrode, the center measurement substrate pad, the second center measurement connection electrode, the second edge measurement connection electrode, the second edge measurement substrate pad, and the second measurement terminal, is formed.

* * * * *